(12) United States Patent
Sato et al.

(10) Patent No.: US 8,848,327 B2
(45) Date of Patent: Sep. 30, 2014

(54) CONTROLLER, CONTROLLING METHOD, AND SOLAR CELL

(75) Inventors: Atsushi Sato, Kanagawa (JP); Yoshiaki Inoue, Aichi (JP); Mikio Takenaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 300 days.

(21) Appl. No.: 13/161,589

(22) Filed: Jun. 16, 2011

(65) Prior Publication Data

US 2011/0317320 A1    Dec. 29, 2011

(30) Foreign Application Priority Data

Jun. 29, 2010   (JP) .................................. 2010-148035

(51) Int. Cl.
| | | |
|---|---|---|
| *H02H 3/00* | (2006.01) | |
| *H01L 31/02* | (2006.01) | |
| *H01L 31/04* | (2014.01) | |
| *H02M 7/539* | (2006.01) | |

(52) U.S. Cl.
CPC ......... *H01L 31/02021* (2013.01); *Y02E 10/542* (2013.01)
USPC ............................... 361/79; 320/101; 363/79

(58) Field of Classification Search
CPC ................. Y02E 10/542; H01L 31/02021
USPC .................................. 361/79; 320/101; 363/79
See application file for complete search history.

(56) References Cited

U.S. PATENT DOCUMENTS

| | | | | |
|---|---|---|---|---|
| 5,621,300 A | * | 4/1997 | Sato et al. ...................... | 320/101 |
| 6,479,745 B2 | * | 11/2002 | Yamanaka et al. ............. | 136/263 |
| 2007/0132426 A1 | * | 6/2007 | Kim et al. ....................... | 320/101 |

FOREIGN PATENT DOCUMENTS

JP    2008-192441 A    8/2008

OTHER PUBLICATIONS

O'Regan, Brian et al., "A low-cost, high-efficiency solar cell based on dye-sensitized colloidal TiO$_2$ films", Letters to Nature, Oct. 24, 1991, pp. 737-740, vol. 353, Switzerland.

* cited by examiner

*Primary Examiner* — Jared Fureman
*Assistant Examiner* — Lucy Thomas
(74) *Attorney, Agent, or Firm* — Wolf, Greenfield & Sacks, P.C.

(57) ABSTRACT

Disclosed is a controller for controlling short-circuit across positive and negative terminals of a dye sensitized solar cell for converting a light energy into an electrical energy. The controller includes: a voltage detecting section detecting a voltage developed across the positive and negative terminals of the cell; a current detecting section detecting a current caused to flow through the positive terminal of the cell; a judging section judging how a power generation state of the cell is, and whether or not a release state is provided across the positive and negative terminals of the cell in accordance with a value of the voltage detected by the voltage detecting section and a value of the current detected by the current detecting section; and a short-circuiting/releasing section short-circuiting or releasing across the positive and negative terminals of the cell in accordance with a result of the judgment made by the judging section.

12 Claims, 5 Drawing Sheets

101

102

101

103A  103

101

CONTROLLER, CONTROLLING METHOD, AND SOLAR CELL

BACKGROUND

The present disclosure relates to a controller, a controlling method, and a solar cell. More particularly, the disclosure relates to a controller and a controlling method each of which enables deterioration of power generation characteristics of a solar cell to be suppressed, and the solar cell.

A solar cell as a photoelectric conversion element for converting a solar light into an electrical energy uses the solar light as an energy source. Therefore, an influence of the solar cell exerted on the earth's environment is very small. Thus, in recent years, further popularization of the solar cell has been expected.

Heretofore, a crystalline silicon system solar cell using single-crystalline or polycrystalline silicon, and an amorphous silicon system solar cell have been mainly used as the solar cell.

On the other hand, a dye sensitized solar cell which was proposed in 1991 by Michael Grätzel et al. has attracted attention because a high photoelectric conversion efficiency can be obtained in the dye sensitized solar cell, unlike the existing silicon system solar cell, a large-scale system is not necessary during the manufacture for the dye sensitized solar cell, the dye sensitized solar cell can be manufactured at low cost, and so forth. The dye sensitized solar cell, for example, is described in Nature, 353, p. 737 (1991).

Now, the dye sensitized solar cell uses an electrolyte layer (in a phase of either a liquid or a solid), including an organic solvent or an ion liquid containing therein a redox species, a gel and the like. Therefore, in the case where although the dye sensitized solar cell is put under a light radiation environment (under a power generation environment), an external circuit connected between power collecting portions of the dye sensitized solar cell is held in an open circuit state, or the dye sensitized solar cell is under a use circumstance in which an electric power is not consumed so much (in a word, in the case where a release state is provided across the power collecting portions), a polarization phenomenon is easy to generate in the electrolyte layer of the dye sensitized solar cell. Also, it is feared that when the generation of such a polarization phenomenon causes a reduction in the power generation characteristics of the dye sensitized solar cell.

Describing more specifically, it is known that in the case where the light is radiated to the dye sensitized solar cell, and the external circuit of the dye sensitized solar cell is held in the open circuit state, the electrons are accumulated in an interface between a conductive transparent electrode (made of an FTO (Fluorine Tin Oxide), an ITO (Indium Tin Oxide) or the like) of a semiconductor electrode and $TiO_2$.

Since not only under the solar light, but also under an indoor fluorescent light, the dye becoming an electron supply source is excited, the electrons are continuously supplied from the dye, and thus the electron accumulation can be caused.

The polarization is generated inside the dye sensitized solar cell when the electrons are continuously accumulated in the interface between the conductive transparent electrode and $TiO_2$ in such a way. Specifically, the electrons are leaked from the interface between the conductive transparent electrode and $TiO_2$, and a redox component of the electrolyte layer is reduced, so that composition balance between an oxidant and a reductant is lost.

With regard to the possibility of the reverse electron transfer, for example, there are considered three kinds of reactions: (1) deactivation of the dye from the excited state; (2) movement of the electrons from $TiO_2$ to the redox component; and (3) movement of the electrons from the conductive transparent electrode to the redox component. Of the three kinds of reactions, the reaction mentioned in (3) is fastest. Therefore, the reaction stated in the paragraph right before this paragraph is easy to preferentially occur, and thus the polarization phenomenon is easily generated.

In particular, since the larger an area of the dye sensitized solar cell (the larger the current generated by the dye sensitized solar cell), the more an amount of electrons generated in one dye excitation, the polarization phenomenon is readily generated.

Such a polarization phenomenon is the phenomenon peculiar to the dye sensitized solar cell using the electrolyte layer (in the phase of either the liquid or the solid), including the organic solvent or the ion liquid containing therein the redox species, the gel and the like, and is also a deterioration mode which could not be supposed in the existing silicon system solar cell (using the single-crystalline silicon, the amorphous silicon or the like).

In order to cope with such a situation, there was devised a method in which an electrode for current application was specially provided in the dye sensitized solar cell, a reverse current was applied from the electrode to the dye sensitized solar cell by using an external power source to reduce the polarization phenomenon generated, thereby recovering the deteriorated power generation characteristics of the dye sensitized solar cell. This method, for example, is disclosed in Japanese Patent Laid-Open No. 2008-192441 (Patent Document 1).

SUMMARY

However, with the existing method, it might be impossible to suppress the deterioration of the power generation characteristics of the dye sensitized solar cell.

In general, the solar cell is used in a state of being connected to an external load circuit, an external secondary battery or the like. In a word, the electric power generated by the solar cell is consumed in the external circuit or accumulated in the external circuit. However, when the external load circuit is not operated with the electric power generated by the solar cell, or when the external secondary battery is in a full charge state, the power consumption is not carried out. In a word, the external circuit becomes the open circuit state.

In addition thereto, the dye sensitized solar cell generates continuously the electric power while the light is radiated to the dye sensitized solar cell. In a word, even when the external circuit becomes the open state, it may be impossible for the dye sensitized solar cell to stop the power generation. Therefore, it is feared that as described above, the polarization phenomenon is generated in the dye sensitized solar cell, thereby deteriorating the power generation characteristics of the dye sensitized solar cell.

Although with the method disclosed in Patent Document 1, the power generation characteristics deteriorated could be recovered, it might be impossible to suppress the deterioration itself.

The present disclosure has been made in order to solve the problems described above, and it is therefore desirable to provide a controller and a controlling method each of which is capable of suppressing deterioration of power generation characteristics of a solar cell, and the solar cell.

In order to attain the desire described above, according to an embodiment of the present disclosure, there is provided a controller for controlling short-circuit across a positive terminal and a negative terminal of a dye sensitized solar cell for converting a light energy into an electrical energy, the controller including:

a voltage detecting section detecting a voltage developed across the positive terminal and the negative terminal of the dye sensitized solar cell;

a current detecting section detecting a current caused to flow through the positive terminal of the dye sensitized solar cell;

a judging section judging how a power generation state of the dye sensitized solar cell is, and whether or not a release state is provided across the positive terminal and the negative terminal of the dye sensitized solar cell in accordance with a value of the voltage detected by the voltage detecting section and a value of the current detected by the current detecting section; and a short-circuiting/releasing section short-circuiting or releasing across the positive terminal and the negative terminal of the dye sensitized solar cell in accordance with a result of the judgment made by the judging section.

According to another embodiment of the present disclosure, there is provided a controlling method of controlling short-circuit across a positive terminal and a negative terminal of a dye sensitized solar cell for converting a light energy into an electrical energy, the controlling method including:

detecting a voltage developed across the positive terminal and the negative terminal of the dye sensitized solar cell by a voltage detecting section of a controller;

detecting a current caused to flow through the positive terminal of the dye sensitized solar cell by a current detecting section of the controller;

judging how a power generation state of the dye sensitized solar cell is, and whether or not a release state is provided across the positive terminal and the negative terminal of the dye sensitized solar cell in accordance with values of the voltage and the current which are detected by a judging section of the controller; and short-circuiting or releasing across the positive terminal and the negative terminal of the dye sensitized solar cell in accordance with a result of the judgment made by a short-circuiting/releasing section of the controller.

According to further embodiment of the present disclosure, there is provided a solar cell, including:

a dye sensitized solar cell for converting a light energy into an electrical energy;

a voltage detecting section detecting a voltage developed across a positive terminal and a negative terminal of the dye sensitized solar cell;

a current detecting section detecting a current caused to flow through the positive terminal of the dye sensitized solar cell;

a comparing section comparing a first parameter proportional to a value of the voltage detected by the voltage detecting section, and a second parameter proportional to a value of the current detected by the current detecting section with each other; and a short-circuiting/releasing section short-circuiting or releasing across the positive terminal and the negative terminal of the dye sensitized solar cell in accordance with a magnitude relationship, between the first parameter and the second parameter, obtained as a result of the comparison made by the comparing section.

According to still further embodiment of the present disclosure, there is provided a controlling method of controlling short-circuit across a positive terminal and a negative terminal of a dye sensitized solar cell, the controlling method including:

detecting a voltage developed across the positive terminal and the negative terminal of the dye sensitized solar cell for converting a light energy into an electrical energy by a voltage detecting section of the dye sensitized solar cell;

detecting a current caused to flow through the positive terminal of the dye sensitized solar cell by a current detecting section of the dye sensitized solar cell;

comparing a first parameter proportional to a value of the voltage thus detected, and a second parameter proportional to a value of the current thus detected with each other by a comparing section of the dye sensitized solar cell; and short-circuiting or releasing across the positive terminal and the negative terminal of the dye sensitized solar cell in accordance with a magnitude relationship, between the first parameter and the second parameter, obtained as a result of the comparison by a short-circuiting/releasing section of the dye sensitized solar cell.

As set forth hereinabove, according to the present disclosure, it is possible to control the connection between the positive terminal and the negative terminal of the solar cell. In particular, it is possible to suppress the deterioration of the power generation characteristics of the solar cell.

DETAILED DESCRIPTION OF THE PREFERRED EMBODIMENTS

Embodiments of the present disclosure will be described in detail hereinafter with reference to the accompanying drawings. It is noted that the description will be given below in accordance with the following order:

(1) Deterioration Due to Polarization Phenomenon (Description of Temporal Change in Correction Efficiency);

(2) First Embodiment (Deterioration Suppressing Controller);

(3) Second Embodiment (Deterioration Suppression Controlling Method); and (4) Third Embodiment (Solar Cell with Deterioration Suppressing Function).

1. Deterioration Due to Polarization Phenomenon

Firstly, a description will be given with respect to an example of deterioration of power generation characteristics of a dye sensitized solar cell due to a polarization phenomenon. Temporal Changes in power generation characteristics of a dye sensitized solar cell module including eight panels of the dye sensitized solar cells connected in series are compared with one another with respect to three patterns (three states between power collecting portions) of an external circuit to which the dye sensitized solar cell module is connected.

Figure 1A:
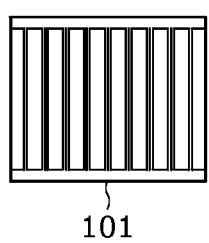
FIGS. 1A to 1C are respectively diagrams showing pattern examples of an external circuit of a dye sensitized solar cell.

A first state, as shown in FIG. 1A, is a state (open circuit state) in which a release state is provided across the power collecting portions of the dye sensitized solar cell module 101. In this case, a resistance value between the power collecting portions is infinitely large. Therefore, current-voltage characteristics obtained between the power collecting portions of the dye sensitized solar cell module 101 correspond to a point (close to a circled numeric character "1") at which a current density on the I-V characteristic curve in a graph shown in FIG. 1D becomes zero.

Figure 1B:
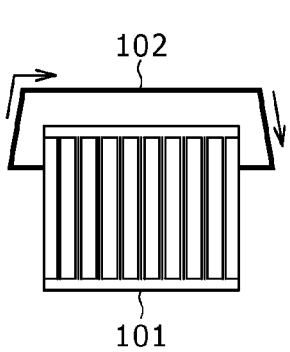

A second state, as shown in FIG. 1B, is a state (closed circuit state) in which the power collecting portions of the dye sensitized solar cell module 101 are short-circuited by a closed circuit 102. The closed circuit 102 is a circuit having a resistance value of zero. In a word, the resistance value between the power collecting portions is zero. Therefore, the current-voltage characteristics obtained between the power collecting portions of the dye sensitized solar cell module 101 at this time correspond to a point (close to a circled numeric character "2") at which a voltage on the I-V characteristic curve in the graph shown in FIG. 1D becomes zero.

Figure 1C:
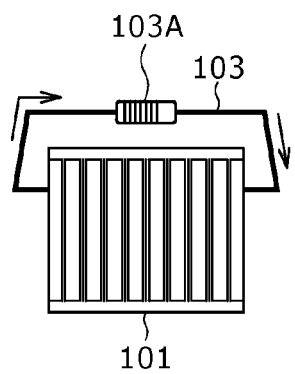
Figure 1D:
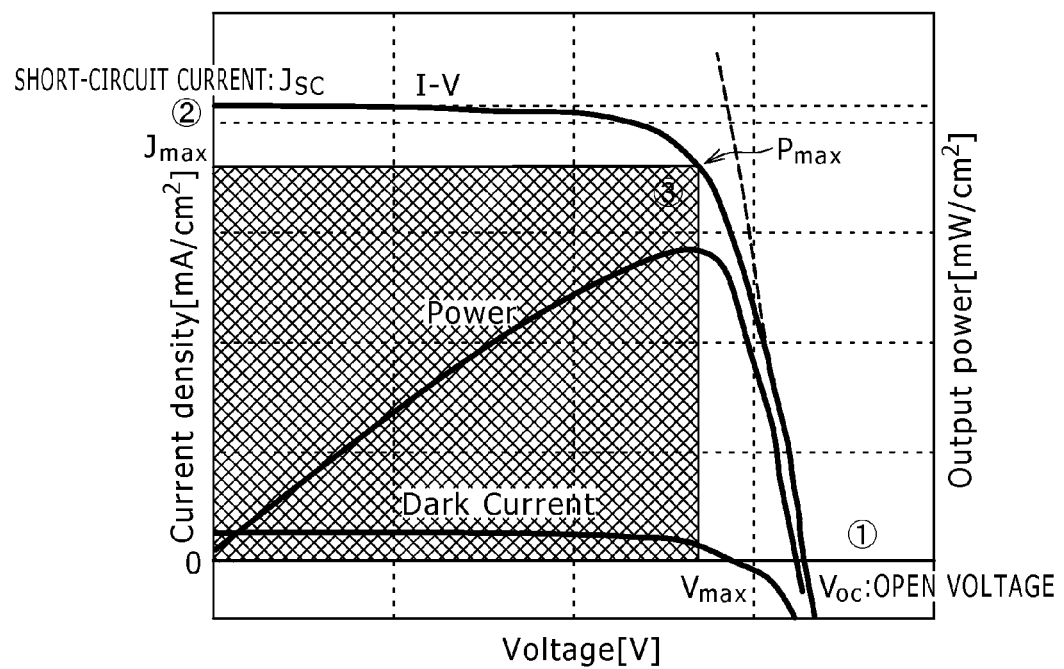
FIG. 1D is a graph representing current-voltage characteristics obtained between power collecting portions in the external circuit of the dye sensitized solar cell.

A third state, as shown in FIG. 1C, is a state (closed circuit state) in which the power collecting portions of the dye sensitized solar cell module 101 are short-circuited by a closed circuit 103 including a resistor 103A. A resistance value of the resistor 103A is set as such a value that the electric power becomes maximum. Therefore, the current-voltage characteristics obtained between the power collecting portions of the dye sensitized solar cell module 101 at this time correspond to a point (close to a circled numeric character "3") at which a voltage (V) developed across the power collecting portions and a current (J), caused to flow through the power collecting portions, which lie on the I-V characteristic curve in the graph shown in FIG. 1D get together such a value ($V_{max}$, $J_{max}$) as to provide a maximum electric power.

Figure 2:
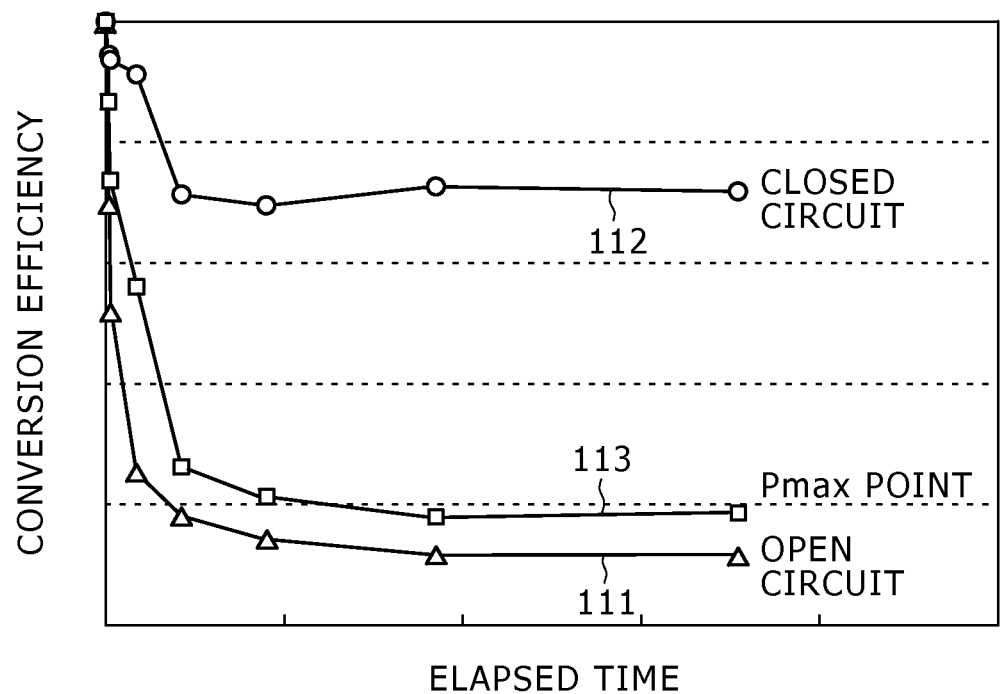
FIG. 2 is a graph representing an example of a temporal change in conversion efficiency of the dye sensitized solar cell.

FIG. 2 are graphs showing examples of temporal changes (accelerated test for light deterioration) in conversion efficiency of the dye sensitized solar cell module when the dye sensitized solar cell modules set in the three states as described above, respectively, were stationarily placed under a halogen light radiation environment for a long time.

In the graphs shown in FIG. 2, a curve 111 shows the example of the temporal change in conversion efficiency of the dye sensitized solar cell module 101 set in the first state (refer to FIG. 1A). Also, a curve 112 shows the example of the temporal change in conversion efficiency of the dye sensitized solar cell module 101 set in the second state (refer to FIG. 1B). In addition, a curve 113 shows the example of the temporal change in conversion efficiency of the dye sensitized solar cell module 101 set in the third state (refer to FIG. 1C).

As shown in FIG. 2, even in any of the first to third states, basically, the conversion efficiency of the dye sensitized solar cell module 101 has a tendency to be reduced with time due to an influence of the light deterioration. However, an amount of reduction of the conversion efficiency of the dye sensitized solar cell module 101 is largest in the first state (open circuit state) among the first to third states.

The dye sensitized solar cell has a structure in which an electrolyte layer is interposed between a titanium porous electrode which is made to support a sensitizing dye, and a counter electrode. For example, in the case of the dye sensitized solar cell using an electrolyte solution containing therein a redox pair (such as a pair of $I^-$ and $I_3^-$) as an electrolyte layer, when a light impinges on the titanium porous electrode in a phase of power generation in the daytime or the like, the sensitizing dye absorbs the light to discharge the electrons therefrom into the titanium porous electrode. At this time, the holes left in the sensitizing dye oxidize iodine ions ($I^-$) to change the iodine ions into triiodide ions ($I_3^-$). In addition, the electrons discharged from the sensitizing dye into the titanium porous electrode are moved to the counter electrode through a circuit. Then, the electrons reduce the triiodide ions ($I_3^-$) in the counter electrode to change the triiodide ions ($I_3^-$) into the iodide ions ($I^-$). Also, this cycle is continuously generated, thereby converting a light energy into an electrical energy.

However, when the light is radiated to the dye sensitized solar cell, and the external circuit of the dye sensitized solar cell is held in the open circuit state, the bias occurs in a ratio of the redox pair contained in the electrolyte solution, which causes the deterioration of the characteristics of the dye sensitized solar cell (that is, the reduction in photoelectric conversion efficiency). The following is considered as this reason for the deterioration of the characteristics of the dye sensitized solar cell.

That is to say, the triiodide ions ($I_3^-$) and the iodide ions (I) exist in the form of the redox pairs in the electrolyte solution. However, the iodide ions ($I^-$) come to be eccentrically located in the vicinity of the titanium porous electrode due to the reverse electron transfer of the electrons accumulated in the titanium porous electrode to the redox pairs, and also the triiodide ions ($I_3^-$) come to be eccentrically located in the vicinity of the counter electrode. As a result, the conductive property of the electrolyte solution is reduced.

When the release state is provided across the power collecting portions of the dye sensitized solar cell module in such a way, it is feared that the polarization is more strongly generated, and thus the power generation characteristics of the dye sensitized solar cell module is largely deteriorated.

2. First Embodiment

Deterioration Suppressing Controller

Figure 3:
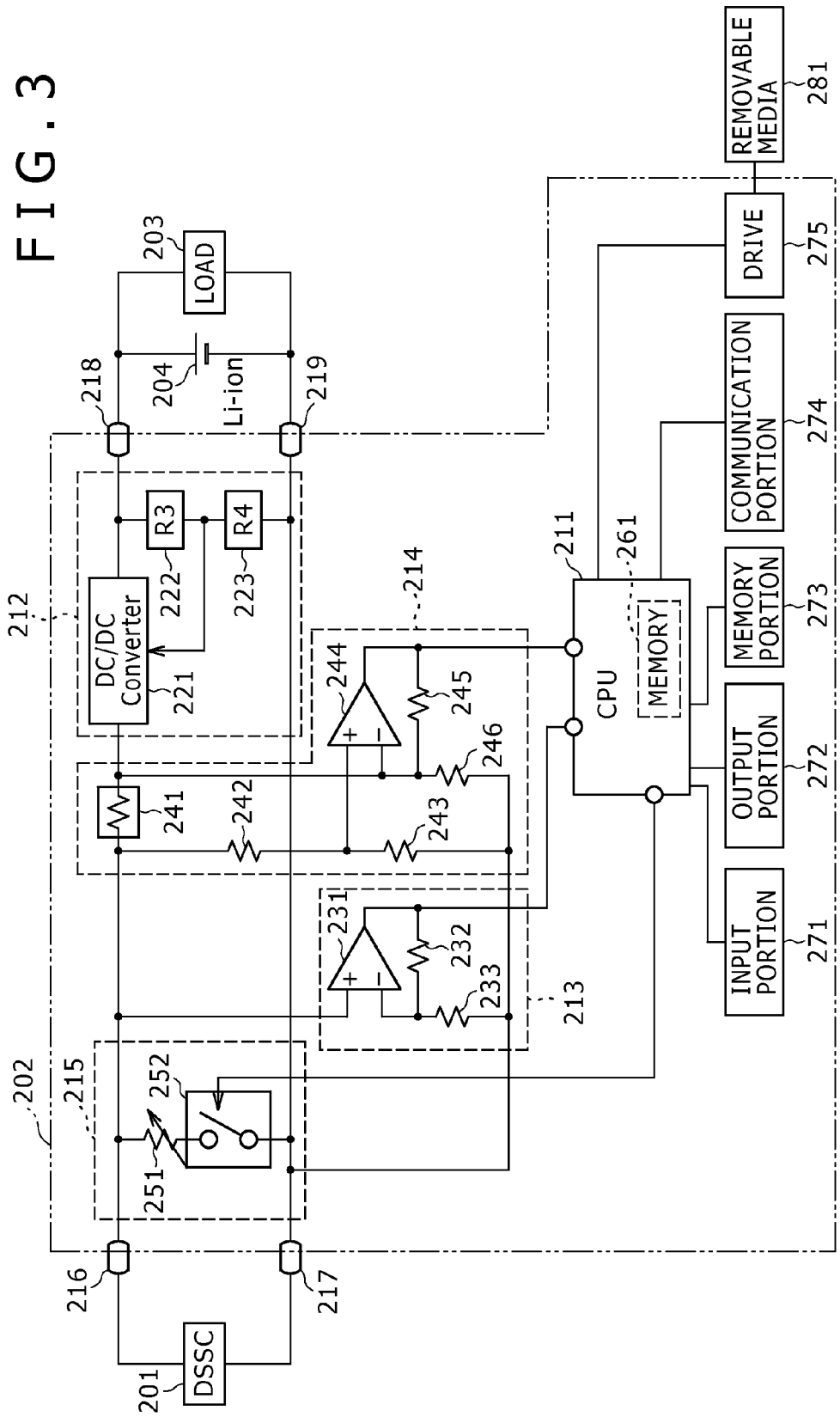
FIG. 3 is a circuit diagram, partly in block, explaining a configuration of a controller according to a first embodiment of the present disclosure.

FIG. 3 is a circuit diagram explaining a configuration of a controller according to a first embodiment of the present disclosure. A deterioration suppressing controller 202 shown in FIG. 3 is an apparatus for suppressing deterioration of power generation characteristics of a Dye Sensitized Solar Cell (hereinafter referred to as "a DSSC" for short) 201 due to a polarization phenomenon. In this case, the DSSC 201 has a structure in which an electrolyte solution is interposed between a titanium porous electrode which is made to support a sensitizing dye, and a counter electrode. Also, the DSSC 201 is a photoelectric conversion portion for converting a light energy into an electrical energy.

The deterioration suppressing controller 202 is connected in parallel between the DSSC 201, and a load circuit 203 and a secondary battery 204. In a word, the DSSC 201 is connected to the load circuit 203 and the secondary battery 204 each serving as an external circuit through the deterioration suppressing controller 202.

The load circuit 203 is a circuit which consumes an electric power generated in the DSSC 201, or an electric power accumulated in the secondary battery 204 to be driven with the electric power. A configuration and contents of processing to be executed of the load circuit 203 is arbitrary. That is to say, any circuit may be used as the load circuit 203 as long as it consumes the electric power generated in the DSSC 201, or the electric power accumulated in the secondary battery 204 to be driven with the electric power.

The secondary battery 204 is composed of a secondary battery such as a lithium ion battery, and accumulates therein an excess electric power, of the electric power generated in the DSSC 201, which is not consumed in the load circuit 203. The electric power accumulated in the secondary battery 204 is supplied to the load circuit 203 as may be necessary.

For example, in the case where the load circuit 203 is not driven to be held in a pausing state, the electric power generated in the DSSC 201 is stored in the secondary battery 204 until the full charge is obtained in the secondary battery 204. In addition, for example, in the case where even when the load circuit 203 is driven, the load circuit 203 does not consume all of the electric power obtained in the DSSC 201, the excess electric power is stored in the secondary battery 204 until the full charge is obtained in the secondary battery 204.

In addition, for example, when the DSSC 201 generates no electric power as with the night, the load circuit 203 receives the electric power supplied thereto from the secondary battery 204 to be driven. In addition, for example, when an electric-generating capacity of the DSSC 201 is less than the power consumption of the load circuit 203, the load circuit 203 receives the electric power supplied thereto from the secondary battery 204, thereby making up for the shortfall of the electric power.

Any secondary battery may be used as the secondary battery 204 as long as it can store therein the electric power.

The deterioration suppressing controller 202 drives the DSSC 201 so as not to generate the polarization phenomenon in the DSSC 201, thereby suppressing the deterioration of the power generation characteristics of the DSSC 201. The deterioration suppressing controller 202 includes a Central Processing Unit (CPU) 211, a voltage converting portion 212, a voltage detecting portion 213, a current detecting portion 214, a short-circuiting portion 205, and terminals 216 to 219.

As shown in FIG. 3, a positive terminal of the DSSC 201 is connected to the terminal 216, and a negative terminal of the DSSC 201 is connected to the terminal 217. The terminal 216 is connected to the terminal 218 through the short-circuiting portion 215, the current detecting portion 214, and the voltage converting portion 212 in order. The terminal 217 is connected to the terminal 219 through the short-circuiting portion 215, the current detecting portion 214, and the voltage converting portion 212 in order. Also, the terminal 218 is connected to each of one terminal of the load circuit 203, and the positive terminal of the secondary battery 204. In addition, the terminal 219 is connected to each of the other terminal of the load circuit 203, and the negative terminal of the secondary battery 204.

As shown in FIG. 3, the voltage converting portion 212 includes a DC/DC Converter 221, a resistor (R3) 222, and a resistor (R4) 223, and carries out the voltage conversion. For example, the DC/DC converter 221 converts the voltage in accordance with a ratio in resistance value of the resistor (R3) 222 to the resistor (R4) 223. In a word, the voltage developed across the terminal 218 and the terminal 219 is a voltage obtained through the DC/DC conversion in the DC/DC converter 221. The voltage obtained through the DC/DC conversion is supplied to each of the load circuit 203 and the secondary battery 204.

For the purpose of knowing how the power generation state of the DSSC 201 is, the voltage detecting portion 213 detects a value of the voltage developed across the terminal 216 and the terminal 217. As shown in FIG. 3, the voltage detecting portion 213 includes an operational amplifier 231, a resistor 232, and a resistor 233. The voltage detecting portion 213 supplies the voltage developed across the positive terminal and the negative terminal of the DSSC 201 thus detected to the CPU 211.

For the purpose of knowing how the power generating state of the DSSC 201 is, the current detecting portion 214 detects a value of a current caused to flow from the positive terminal side of the DSSC 201. As shown in FIG. 3, the current detecting portion 214 includes a current detecting resistor 241, a resistor 242, a resistor 243, an operational amplifier 244, a resistor 245, and a resistor 246. Both terminals of the current detecting resistor 241 are connected to the terminal 216 connected to the positive terminal of the DSSC 201, and an input terminal of the DC/DC converter 221, respectively. The current detecting portion 214 acquires an electromotive force generated across both terminals of the current detecting resistor 241, and detects a value of a current caused to flow through the current detecting resistor 241. The current detecting portion 214 supplies the current whose value is detected to the CPU 211.

The CPU 211 executes arithmetic operation processing and thus judges how the power generation state of the DSSC 201 is, and whether or not the open circuit (release) state is provided across the positive terminal and the negative terminal of the DSSC 201 in accordance with the value of the voltage supplied thereto from the voltage detecting portion 213, and the value of the current supplied from the current detecting portion 214.

For example, when it is detected that the voltage having the sufficient magnitude is generated across the positive terminal and the negative terminal of the DSSC 201, and it is also detected that the current having the sufficient magnitude is caused to flow through the current detecting resistor 241, the CPU 211 judges that the electric power generated in the DSSC 201 is either supplied to the load circuit 203 to be consumed therein, or supplied to the secondary battery 204 to be stored therein.

In addition, for example, when it is detected that the voltage having the sufficient magnitude is generated across the positive terminal and the negative terminal of the DSSC 201, and the current having the sufficient magnitude is not detected in the current detecting resistance 241, the CPU 211 judges that although the DSSC 201 generates the electric power, the load circuit 203 is not driven, and the secondary battery 204 is held in the full charge state, and the open circuit (release) state is provided across the positive terminal and the negative terminal of the DSSC 201.

In addition, for example, when it is not detected that the voltage having the sufficient voltage is generated across the positive terminal and the negative terminal of the DSSC 201, the CPU 211 judges that the DSSC 201 generates no electric power.

It is noted that judging which level and what kind of state the voltage or current is at and in (criterion for judgment) is previously determined in accordance with the specification or the like of the DSSC 201, the load circuit 203, and the secondary battery 204 in such a way that the judgment can be suitably carried out. It is to be understood that this criterion for judgment can also be changed to another one. For example, a procedure may also be adopted such that a user can suitably adjust this criterion for judgment in accordance with the specifications or the like of the load circuit 203 and the secondary battery 204. In addition, a procedure may also be adopted such that the CPU 211 suitably adjusts this criterion for judgment in accordance with the specifications or the like of the DSSC 201, the load circuit 203, and the secondary battery 204 which are all connected to the deterioration suppressing controller 202.

As shown in FIG. 3, the CPU 211 has a memory 261 built therein. The memory 261, for example, is composed of a Read Only Memory (ROM), a Random Access Memory (RAM) or the like, and has a memory area in which a program, data and the like are stored. The CPU 211 executes the program stored in the memory 261, and executes the arithmetic operation processing described above by using the data stored in the memory 261. Of course, the memory 261 may be provided outside the CPU 211.

The CPU 211 executes control processing as well. The CPU 211 controls the short-circuiting portion 215 in accordance with the result of the arithmetic operation processing.

As shown in FIG. 3, the short-circuiting portion 215 is connected between the terminal 216 and the terminal 217, and controls whether or not both the terminal 216 and the terminal 217, that is, the positive terminal and the negative terminal of the DSSC 201 should be connected (short-circuited) to each other. The short-circuiting portion 215 includes a variable resistor 251 and a switch 252.

The variable resistor 251 controls the value of the current which is caused to flow through the DSSC 201 when the terminal 216 and the terminal 217 are short-circuited. For suppressing more strongly the generation of the polarization phenomenon in the DSSC 201, preferably, the more current is caused to flow through the DSSC 201 (readily caused to flow through the DSSC 201). However, when the excessive current is caused to flow through the DSSC 201, there is the possibility that the DSSC 201 is destroyed. In order to cope with this situation, a resistance value of the variable resistor 251 is set as such a value as to prevent the large current to be caused to flow through the DSSC 201 to the extent that the DSSC 201 is not destroyed. The control for the resistance value of the variable resistor 251 may be carried out by the CPU 211, otherwise may be carried out by the user.

The switch 252 is a switch circuit for controlling the short-circuit across the terminal 216 and the terminal 217. By turning ON (closing) the switch 252, the terminal 216 and the terminal 217, that is, the positive terminal and the negative terminal of the DSSC 201 are connected (short-circuited) to each other.

The closing of the switch 252 is carried out in accordance with the control made by the CPU 211. As described above, when the CPU 211 judges that the DSSC 201 generates the electric power and the open circuit (release) state is provided across the positive terminal and the negative terminal of the DSSC 201, for the purpose of suppressing the generation of the polarization phenomenon in the DSSC 201, the CPU 211 turns ON (closes) the switch 252. In any of other cases, the CPU 211 turns OFF (opens) the switch 252.

A period of time until the positive terminal and the negative terminal of the dye sensitized solar cell are short-circuited after the dye sensitized solar cell becomes the open state is preferably a processing period of time which is shorter than a period of time until the release state is provided across the positive terminal and the negative terminal of the dye sensitized solar cell, an oxidation-reduction reaction of the iodine ions contained in the electrolyte solution is stopped, and as a result, a difference in electric potential is generated across both the positive terminal and the negative terminal of the dye sensitized solar cell. The reason for this is that the remarkable losing of the oxidation-reduction balance of the element is prevented by the difference in electric potential. A period of time until the iodine ions interact with each other can be calculated based on a diffusion coefficient of the iodine ions, and a distance between the iodine ions.

As a result, the positive terminal and the negative terminal of the DSSC 201 are short-circuited when the DSSC 201 generates the electric power and also the open circuit (release) state is provided across the positive terminal and the negative terminal of the DSSC 201. Therefore, the generation of the polarization phenomenon in the DSSC 201 is suppressed. In a word, the deterioration of the power generation characteristics of the DSSC 201 is suppressed.

It is noted that an input portion 271, an output portion 272, a memory portion 273, a communication portion 274, and a drive 275 are suitably connected to the CPU 211 of the deterioration suppressing controller 202.

The input portion 271 is composed of an arbitrary input device such as a keyboard, a mouse, a button, or a touch panel, an input terminal or the like. Also, the input portion 271 receives information inputted thereto from the user or the outside such as another apparatus, and supplies the information thus inputted thereto to the CPU 211.

The output portion 272 is composed of a display device such as a Cathode Ray Tube (CRT) or a Liquid Crystal Display (LCD) device, a speaker or an output terminal. Also, the output portion 272 either provides the information supplied thereto from the CPU 211 in the form of an image or a sound to the user, or outputs the information supplied thereto from the CPU 211 in the form of a predetermined signal to another apparatus.

The memory portion 273, for example, is composed of a Solid State Drive (SSD) such as a flash memory or a hard disc. Also, the memory portion 273 either stores therein the information supplied thereto from the CPU 211, or supplies the information stored therein to the CPU 211.

The communication portion 274, for example, is composed of an interface or a modem of a wired Local Area Network (LAN) or a wireless LAN. Also, the communication portion 274 executes processing for communication with another apparatus through a network including the Internet. For example, the communication portion 274 is controlled by the CPU 211, acquires a computer program through the network including the Internet, and installs the computer program thus acquired in the memory portion 273.

The drive 275 is suitably equipped with a removable media 281 such as a magnetic disc, an optical disc, a magneto optical disc, or a semiconductor memory. For example, the drive 275 is controlled by the CPU 211, reads out the computer program from the removable media 281, and installs the computer program thus read out in the memory portion 273.

3. Second Embodiment

Flow of Processing in Deterioration Suppression Controlling Method

Figure 4:
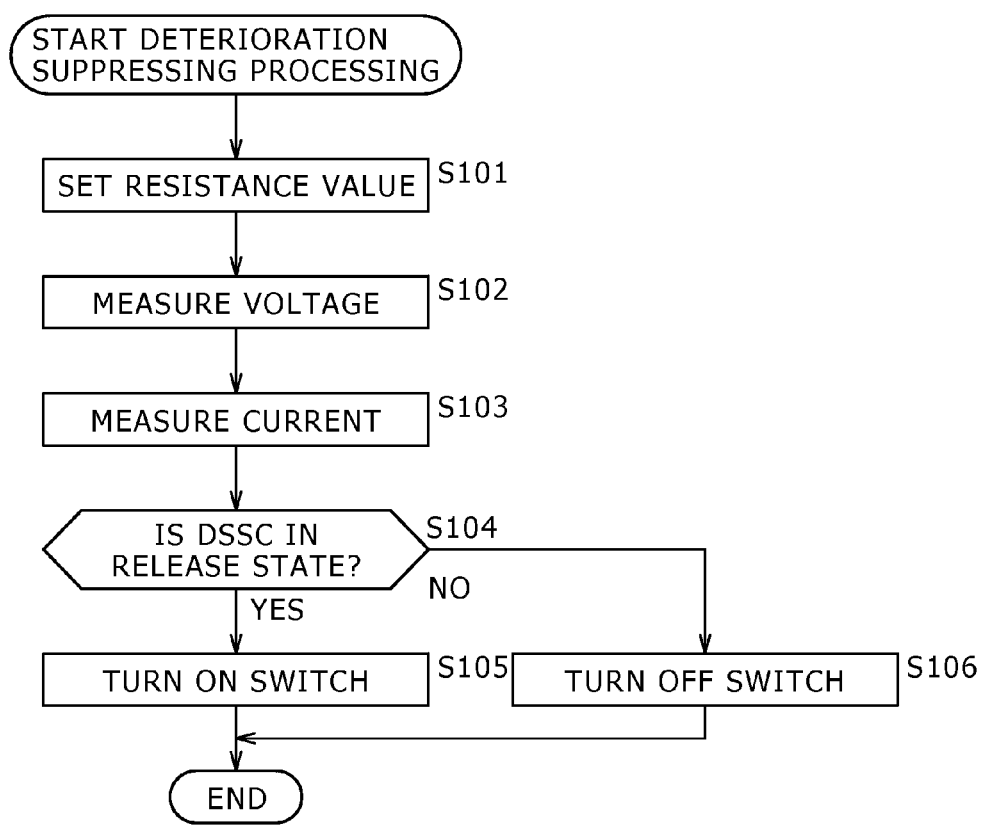
FIG. 4 is a flow chart explaining a flow of deterioration suppressing processing in a controlling method according to a second embodiment of the present disclosure.

Next, a flow of deterioration suppressing processing in a deterioration suppressing controlling method, according to a second embodiment of the present disclosure, which is executed by the deterioration suppressing controller 202 shown in FIG. 3 will be described in detail with reference to FIG. 4.

When the deterioration suppressing processing is started to be executed, in Step S101, the variable resistor 251 is operated to set the resistance value thereof. In Step S102, the voltage detecting portion 213 measures the value of the voltage developed across the positive terminal and the negative terminal of the DSSC 201. In Step S103, the current detecting portion 214 measures the value of the current which is caused to flow through the current detecting resistor 241. In Step S104, the CPU 211 judges whether or not the open circuit (release) state is provided across the positive terminal and the negative terminal of the DSSC 201 although the DSSC 201 generates the electric power in accordance with the value of the voltage detected in Step S102, and the value of the current detected in Step S103.

When it is judged in Step S104 that the open circuit (release) state is provided across the positive terminal and the negative terminal of the DSSC 201, the operation of the CPU 211 proceeds to processing in S105, and the CPU 211 controls the switch 252 to turn ON (close) the switch 252. As a result, the positive terminal and the negative terminal of the DSSC 201 are short-circuited. When the processing in Step S105 ends, the deterioration suppressing processing is completed.

On the other hand, when it is judged in Step S104 that the closed circuit state is provided across the positive terminal and the negative terminal of the DSSC 201, the operation of the CPU 211 proceeds to processing in Step S106, and the CPU 211 controls the switch 252 to turn OFF (open) the switch 252. When the processing in Step S106 ends, the deterioration suppressing processing is completed.

The deterioration suppressing controller 202 suitably executes the deterioration suppressing processing as described above. For example, the deterioration suppressing processing may also be executed either every lapse of a predetermined period of time or every occurrence of an event. In addition, the deterioration suppressing controller 202 may repetitively execute the respective processings from Step S102 to Step S106 in order to monitor and protect the state of the DSSC 201 on a constant basis.

By executing the deterioration suppressing processing in the manner as described above, the deterioration suppressing controller 202 can suppress the biasing of the electrolyte solution in the DSSC 201, thereby suppressing the generation of the polarization phenomenon in the DSSC 201. Also, the deterioration suppressing controller 202 can suppress the deterioration of the power generation characteristics of the DSSC 201 due to the generation of the polarization phenomenon in the DSSC 201. In addition, when the load circuit 203 is driven with the electric power, or the secondary battery 204 can be charged with the electric power, the deterioration suppressing controller 202 releases the short-circuiting portion 215. Therefore, the deterioration suppressing controller 202 can suppress the deterioration of the power generation characteristics of the DSSC 201 caused by the generation of the polarization phenomenon in the DSSC 201.

As described above, it is noted that the deterioration suppressing controller 202 can suppress the deterioration of the power generation characteristics of the DSSC 201 by using the small-scale circuit, and by executing the easy control processing. In a word, the deterioration suppressing controller 202 can suppress unnecessary increases in cost and power consumption caused by the suppression of the deterioration of the power generation characteristics of the DSSC 201.

It is noted that the voltage converting portion 212 can be omitted in the deterioration suppressing controller 202 when a terminal-to-terminal voltage developed across the terminal 216 and the terminal 217, and a terminal-to-terminal voltage developed across the terminal 218 and the terminal 219 are equal to each other in the deterioration suppressing controller 202.

In addition, as will be described later, a comparator may be used instead of using the CPU 211. The output signal from the voltage detecting portion 213 can be regarded as a parameter corresponding (proportional) to a value of the terminal-to-terminal voltage developed across the positive terminal and the negative terminal of the DSSC 201. Also, the output signal from the current detecting portion 214 can be regarded as a parameter corresponding (proportional) to a value of the current caused to flow through the current detecting resistor 241. In a word, the scale adjustment is carried out as may be necessary in consideration of the mutual scales of the two parameters, and the two parameters are compared with each other, whereby the short-circuit across the positive terminal and the negative terminal of the DSSC 201 can be controlled in accordance with a magnitude relationship between the two parameters similarly to the case of the CPU 211. As a result, the control circuit can be further simplified, and the control for the deterioration of the power generation characteristics of the DSSC 201 can be readily carried out.

4. Third Embodiment

Solar Cell with Deterioration Suppressing Function

It is noted that the deterioration suppressing controlling function described above may be incorporated in a solar cell module.

Figure 5:
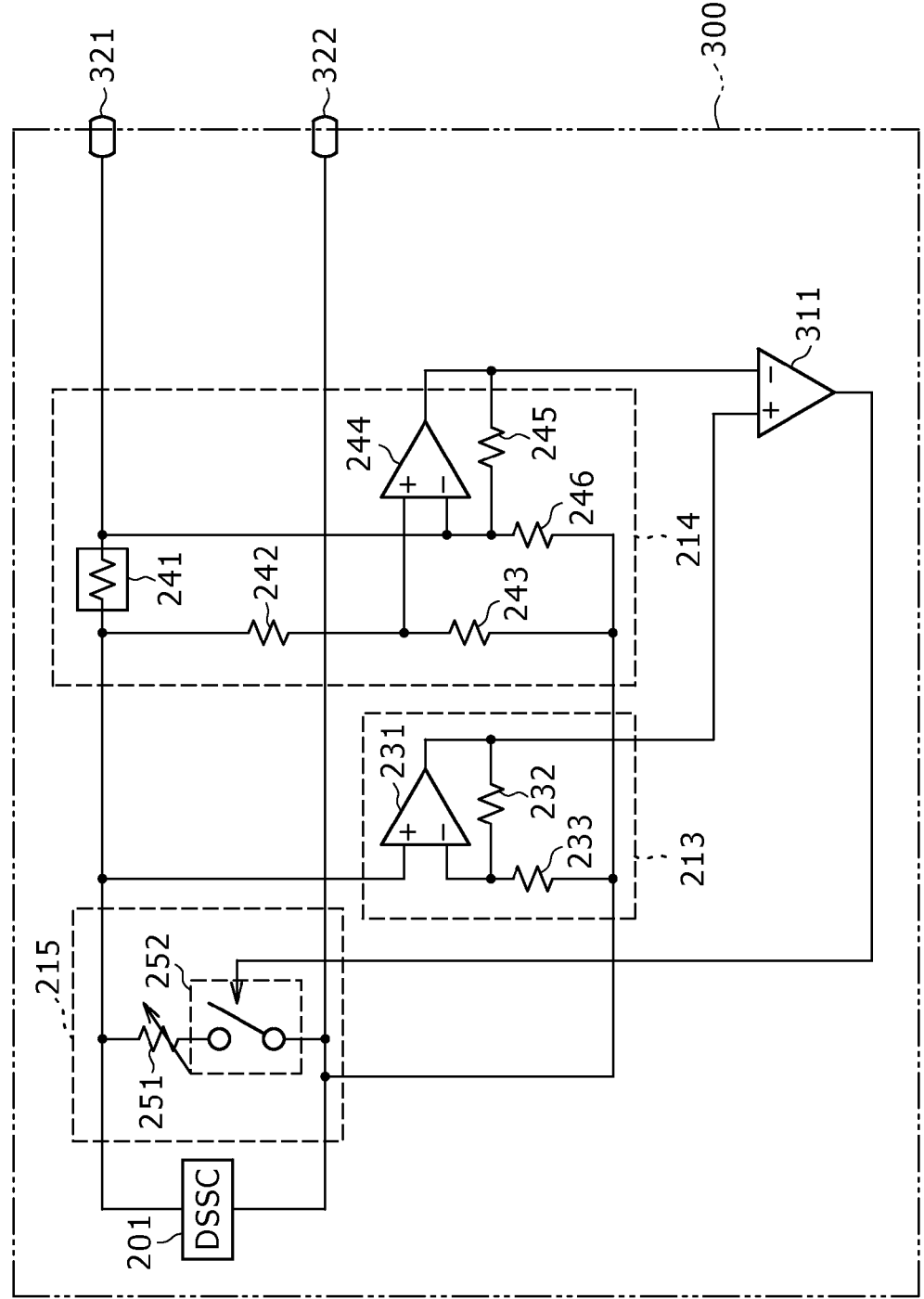
FIG. 5 is a circuit diagram showing a configuration of a solar cell, having a control function, according to a third embodiment of the present disclosure.

FIG. 5 is a circuit diagram showing a main configuration of a solar cell with a deterioration suppressing function according to a third embodiment of the present disclosure.

The solar cell 300 with the deterioration suppressing function shown in FIG. 5 is obtained by adding the deterioration suppressing function described above to the DSSC 201. The solar cell 300 with the deterioration suppressing function includes the voltage detecting portion 213, the current detecting portion 214, and the short-circuiting portion 215 which are similar to those of the deterioration suppressing controller 202 shown in FIG. 3 in addition to the DSSC 201. In addition, the solar cell 300 with the deterioration suppressing function includes a comparator 311 instead of including the CPU 211 of the deterioration suppressing controller 202 shown in FIG. 3.

The voltage detecting portion 213 detects the voltage developed across the positive terminal and the negative terminal of the DSSC 201. Also, the current detecting portion 204 detects the current which is caused to flow through the current detecting resistor 241 provided on the positive terminal of the DSSC 201.

The comparator 311 compares the output signal from the voltage detecting portion 213, and the output signal from the current detecting portion 214 with each other. The output signal from the voltage detecting portion 213 can be regarded as a parameter corresponding (proportional) to a value of the voltage developed across the positive terminal and the negative terminal of the DSSC 201. Also, the output signal from the current detecting portion 214 can be regarded as a parameter corresponding (proportional) to a value of the current which is caused to flow through the current detecting resistor 241.

The comparator 311 carries out the scale adjustment as may be necessary in consideration of both the scales of the two parameters, and compares the two parameters with each other, thereby judging the magnitude relationship between the two parameters. Amounts of adjustments of the scales of the two parameters are previously determined in accordance with a specification of the DSSC 201, specifications of the load circuit and the secondary battery which are supposed to be connected to the solar cell 300 with the deterioration suppressing function, and the like. In a word, the scales of the two parameters are previously adjusted so that the control for the short-circuit/release of the short-circuiting portion 215 can be suitably carried out in accordance with the result of the comparison in the comparator 311.

Of course, the amounts of adjustments of the scales of the two parameters may be made variable. For example, a procedure may also be adopted such that the user can control the amounts of adjustments of the scales of the two parameters in accordance with the specifications or the like of the load circuit and the secondary battery which are connected to the solar cell 300 with the deterioration suppressing function. In addition, there may be provided a control portion for controlling the amounts of adjustments of the scales of the two parameters in accordance with the specifications or the like of the load circuit and the secondary battery which are connected to the solar cell 300 with the deterioration suppressing function. As a result, the solar cell 300 with the deterioration suppressing function can deal with (carry out the suitable control for) the load circuit and the secondary battery which have the more various specifications.

An output signal from the comparator 311 is supplied as a control signal to the switch 252 of the short-circuit portion 215.

When the level of the output signal from the voltage detecting portion 213 is higher than that of the output signal from the current detecting portion 214, in a word, when the voltage developed across the positive terminal and the negative terminal of the DSSC 201 is large and also the current caused to flow through the current detecting resistor 241 is less, the comparator 311 judges that the open circuit (release) state is provided across the positive terminal and the negative terminal of the DSSC 201 although the DSSC 201 generates the electric power. In this case, in accordance with the output signal from the comparator 311, the switch 252 is turned ON (closed), thereby short-circuiting across the positive terminal and the negative terminal of the DSSC 201.

When the level of the output signal from the voltage detecting portion 213 is lower than that of the output signal from the current detecting portion 214, in a word, when the voltage developed across the positive terminal and the negative terminal of the DSSC 201 is small or the current caused to flow through the current detecting resistor 241 is much, the comparator 311 judges either that the DSSC 201 generates no electric power, or that the closed circuit state is provided across the positive terminal and the negative terminal of the DSSC 201. In this case, in accordance with the output signal from the comparator 311, the switch 252 is turned OFF (opened), thereby releasing the positive terminal and the negative terminal of the DSSC 201.

A period of time until the positive terminal and the negative terminal of the DSSC 201 are short-circuited after the release state is provided across the positive terminal and the negative terminal of the DSSC 201 is preferably a processing period of time shorter than a period of time until after the release state is provided across the positive terminal and the negative terminal of the DSSC 201, the oxidation-reduction reaction of the iodine ions contained in the electrolyte solution is stopped, and as a result, the difference in electric potential is generated between the positive terminal and the negative terminal of the DSSC 201. The reason for this is that the remarkable losing of the oxidation-reduction balance of the element is prevented by the difference in electric potential. A period of time until the iodine ions interact with each other can be calculated based on a diffusion coefficient of the iodine ions, and a distance between the iodine ions.

In addition, the solar cell 300 with the deterioration suppressing function includes a terminal 321 and a terminal 322. The terminal 321 is connected to the positive terminal of the DSSC 201 through the short-circuiting portion 215 and the current detecting portion 214 in order. That is to say, the current detecting resistor 241 in the current detecting portion 214 is connected in series between the positive terminal of the DSSC 201, and the terminal 321.

The terminal 322 is connected to the negative terminal of the DSSC 201 through the current detecting portion 214 and the short-circuiting portion 215 in order. Although an illustration is omitted, the terminal 321 and the terminal 322 are connected to each of the load circuit 203 and the secondary battery 204 shown in FIG. 3.

In a word, in other words, the comparator 311 can judge how the power generation state of the DSSC 201 is, and whether or not the open circuit (release) state is provided across the terminal 321 and the terminal 322 by comparing the output signal from the voltage detecting portion 213 and the output signal from the current detecting portion 214 with each other.

For example, the level of the output signal from the current detecting portion 214 becomes lower than that of the output signal from the voltage detecting portion 213 when the DSSC 201 generates the electric power and the load circuit connected between the terminal 321 and the terminal 322 is not operated, or the secondary battery connected between the terminal 321 and the terminal 322 is in the full charge state. Therefore, the switch 252 of the short-circuiting portion 215 is turned ON (closed) in accordance with the output signal from the comparator 311. As a result, the biasing of the electrolyte solution of the DSSC 201 is suppressed, and the generation of the polarization phenomenon in the DSSC 201 is suppressed. In a word, the solar cell 300 with the deterioration suppressing function can suppress the deterioration, of the power generation characteristics of the DSSC 201, caused by the generation of the polarization phenomenon. At this time, the solar cell 300 with the deterioration suppressing function does not have to receive the feedback or the like from the load circuit or the secondary battery in order to confirm how the operation state of the load circuit is, and the charging state of the secondary battery. Thus, the solar cell 300 with the deterioration suppressing function can more easily suppress the deterioration, of the power generation characteristics of the DSSC 201, caused by the generation of the polarization phenomenon in the DSSC 201.

In addition, for example, the level of the output signal from the current detecting portion 214 becomes higher than that of the output signal from the voltage detecting portion 213 when the DSSC 201 generates the electric power, and the load circuit connected between the terminal 321 and the terminal 322 is operated or the secondary battery connected between the terminal 321 and the terminal 322 is in the chargeable state. Therefore, the switch 252 of the short-circuiting portion 215 is turned OFF (opened) in accordance with the output signal from the comparator 311. As a result, the release state is provided across the positive terminal and the negative terminal of the DSSC 201 and the electric power generated in the DSSC 201 is supplied to the load circuit and the secondary circuit which are connected in parallel between the terminal 321 and the terminal 322. In a word, the solar cell 300 with the deterioration suppressing function can suppress the deterioration, of the power generation characteristics of the DSSC 201, caused by the generation of the polarization phenomenon in the DSSC 201 so as not to impede the normal operation.

It is noted that when the DSSC 201 generates no electric power, the level of the output signal from the voltage detecting portion 213 becomes low. Therefore, since the level of the output signal from the voltage detecting portion 213 becomes lower than that of the output signal from the current detecting portion 214, the switch 252 of the short-circuiting portion 215 is turned OFF (opened) in accordance with the output signal from the comparator 311.

The solar cell 300 with the deterioration suppressing function can suppress the deterioration, of the power generation characteristics of the DSSC 201, caused by the generation of the polarization phenomenon in the DSSC 201 in the manner as described above. Also, in the manner as described above, the solar cell 300 with the deterioration suppressing function can be realized in the form of the simple circuit, can more readily suppress the deterioration, of the power generation characteristics of the DSSC 201, caused by the generation of the polarization phenomenon in the DSSC 201, and can suppress the unnecessary increases in cost and power consumption.

It is noted that in the solar cell 300 with the deterioration suppressing function, similarly to the case of the deterioration suppressing controller 202, the CPU 211 can also be used instead of using the comparator 311. In addition, the voltage converting portion 212 similar to the case of the deterioration suppressing controller 202 may be provided between the terminal 321 and the terminal 322, and the current detecting portion 214.

The series of processing described above either can be executed by hardware or can be executed by software.

When the series of processing described above is executed by the software, a program composing the software is installed from a network or a recording medium.

For example, as shown in FIG. 3, separately from the deterioration suppressing controller 202, the recording medium is composed of not only the removable media 281 composed of a magnetic disc (including a flexible disc), an optical disc (including a Compact Disc-Read Only Memory (CD-ROM), and a Digital Versatile Disc (DVD)), a magneto optical disc (including a Mini Disc (MD)), a semiconductor memory or the like in which a program intended to be distributed to be delivered to the user is recorded, but also a hard disc or the like included in the memory 261 or the memory portion 273 in which a program intended to be delivered to the user in a state of being previously incorporated in the deterioration suppressing controller 202 is recorded.

It is noted that the program executed by the computer either may be one which is executed in a time series manner in accordance with the order described in this specification, or may be ones which are executed in parallel or executed at a necessary timing such as a timing at which a call is made.

In addition, in this specification, Steps in which the program recorded in the recording medium includes plural pieces of processing which are executed either in parallel or individually even though not being necessarily processed in a time series manner as well as plural pieces of processing which are executed in a time series manner in accordance with the order described.

In addition, in the foregoing, the configuration which has been described as one unit (or one processing portion) may be made as plural units (or plural processing portions). Contrary to this, in the foregoing, the configuration which has been described as one corresponding to plural circuits (or plural processing portions) may be collectively made so as to correspond to one circuit (or one processing portion). In addition, a configuration other than the above configuration, of course, may be added to the units (or the processing portions). In addition, a part of a configuration of a certain circuit (or a certain processing portion) may be included in a configuration of any other suitable circuit (or any other suitable circuit processing portion) as long as the substantially identical configurations and operations are maintained in terms of the entire system. In a word, the embodiments of the present disclosure are by no means limited to the embodiments described above, and various changes can be made without departing from the subject matter of the present disclosure.

The present disclosure contains subject matter related to that disclosed in Japanese Priority Patent Application JP 2010-148035 filed in the Japan Patent Office on Jun. 29, 2010, the entire content of which is hereby incorporated by reference.

What is claimed is:

1. A controller for controlling short-circuit across a positive terminal and a negative terminal of a dye sensitized solar cell for converting a light energy into an electrical energy, said controller comprising:
   a voltage detecting section configured for detecting a voltage developed across said positive terminal and said negative terminal of said dye sensitized solar cell;
   a current detecting section configured for detecting a current caused to flow through said positive terminal of said dye sensitized solar cell;
   a judging section configured for judging how a power generation state of said dye sensitized solar cell is, and whether or not a release state is provided across said positive terminal and said negative terminal of said dye sensitized solar cell, in accordance with a comparison between a value representing a magnitude of the voltage detected by said voltage detecting section and a value representing a magnitude of the current detected by said current detecting section; and
   a short-circuiting/releasing section configured for short-circuiting or releasing across said positive terminal and said negative terminal of said dye sensitized solar cell in accordance with a result of the judgment made by said judging section.

2. The controller according to claim 1, wherein said current detecting section comprises a current detecting resistor, having one terminal connected to said positive terminal of said dye sensitized solar cell, for detecting a current caused to flow through said current detecting resistor.

3. The controller according to claim 1, wherein said judging section is configured to judge that said dye sensitized solar cell generates the electric power if the value representing the magnitude of the voltage detected by said voltage detecting section is non-zero, and to judge that said dye sensitized solar cell generates no electric power if the value representing the magnitude of the voltage detected by said voltage detecting section is zero.

4. The controller according to claim 1, wherein said judging section is configured to judge that the release state is provided across said positive terminal and said negative terminal of said dye sensitized solar cell if the value representing the magnitude of the current detected by said current detecting section is zero, and to judge that a closed circuit state is provided across said positive terminal and said negative terminal of said dye sensitized solar cell if the value representing the magnitude of the current detected by said current detecting section is non-zero.

5. The controller according to claim 1, wherein said short-circuiting/releasing section is configured to short-circuit across said positive terminal and said negative terminal of said dye sensitized solar cell if said judging section judges that said dye sensitized solar cell generates the electric power, and the release state is provided across said positive terminal and said negative terminal of said dye sensitized solar cell, and to release across said positive terminal and said negative terminal of said dye sensitized solar cell if said judging section judges that said dye sensitized solar cell generates the electric power, and a closed circuit state is provided across said positive terminal and said negative terminal of said dye sensitized solar cell.

6. The controller according to claim 1, wherein said short-circuiting/releasing section comprises a variable resistor and a switch circuit.

7. A controlling method of controlling short-circuit across a positive terminal and a negative terminal of a dye sensitized solar cell for converting a light energy into an electrical energy, said controlling method comprising:
   detecting a voltage developed across said positive terminal and said negative terminal of said dye sensitized solar cell by a voltage detecting section of a controller;
   detecting a current caused to flow through said positive terminal of said dye sensitized solar cell by a current detecting section of said controller;
   judging how a power generation state of said dye sensitized solar cell is, and whether or not a release state is provided across said positive terminal and said negative terminal of said dye sensitized solar cell, in accordance with a comparison between a value representing a magnitude of the voltage detected by the voltage detecting section and a value representing a magnitude of the current detected by the current detecting section; and
   short-circuiting or releasing across said positive terminal and said negative terminal of said dye sensitized solar cell in accordance with a result of the judgment.

8. A solar cell, comprising:
   a dye sensitized solar cell configured for converting a light energy into an electrical energy;
   a voltage detecting section configured for detecting a voltage developed across a positive terminal and a negative terminal of said dye sensitized solar cell;
   a current detecting section configured for detecting a current caused to flow through said positive terminal of said dye sensitized solar cell;
   a comparing section configured for comparing a first parameter representing a magnitude of the voltage detected by said voltage detecting section, and a second parameter representing a magnitude of the current detected by said current detecting section with each other; and
   a short-circuiting/releasing section configured for short-circuiting or releasing across said positive terminal and said negative terminal of said dye sensitized solar cell in accordance with a result of the comparison made by said comparing section.

9. The solar cell according to claim 8, wherein said current detecting section includes a current detecting resistor having one terminal connected to said positive terminal of said dye sensitized solar cell, and detects a current caused to flow through said current detecting resistor.

10. The solar cell according to claim 8, wherein said short-circuiting/releasing section is configured to short-circuit across said positive terminal and said negative terminal of said dye sensitized solar cell if as a result of the comparison made by said comparing section, the first parameter is smaller than the second parameter, and releases across said positive terminal and said negative terminal of said dye sensitized solar cell if as a result of the comparison made by said comparing section, the first parameter is larger than the second parameter.

11. The solar cell according to claim 8, wherein said short-circuiting/releasing section has comprises a variable resistor and a switch circuit.

12. A controlling method of controlling short-circuit across a positive terminal and a negative terminal of a dye sensitized solar cell, said controlling method comprising:
   detecting a voltage developed across said positive terminal and said negative terminal of said dye sensitized solar cell for converting a light energy into an electrical energy by a voltage detecting section of said dye sensitized solar cell;
   detecting a current caused to flow through said positive terminal of said dye sensitized solar cell by a current detecting section of said dye sensitized solar cell;
   comparing a first parameter representing a magnitude of the voltage thus detected, and a second parameter representing a magnitude of the current thus detected with each other by a comparing section of said dye sensitized solar cell; and
   short-circuiting or releasing across said positive terminal and said negative terminal of said dye sensitized solar cell in accordance with a result of the comparison by a short-circuiting/releasing section of said dye sensitized solar cell.

* * * * *